(12) United States Patent
Echtermeyer et al.

(10) Patent No.: US 10,336,471 B2
(45) Date of Patent: Jul. 2, 2019

(54) METHOD AND SYSTEM FOR DESIGNING AN AIRCRAFT

(71) Applicant: Deutsche Lufthansa AG, Cologne (DE)

(72) Inventors: Karl Echtermeyer, Hofheim (DE); Werner Coenen, Frankfurt (DE)

(73) Assignee: DEUTSCHE LUFTHANSA AG, Cologne (DE)

( * ) Notice: Subject to any disclaimer, the term of this patent is extended or adjusted under 35 U.S.C. 154(b) by 1150 days.

(21) Appl. No.: 14/552,549

(22) Filed: Nov. 25, 2014

(65) Prior Publication Data

US 2015/0149137 A1    May 28, 2015

(30) Foreign Application Priority Data

Nov. 26, 2013   (EP) .................................... 13194503

(51) Int. Cl.
  *G06F 17/50*   (2006.01)
  *B64F 5/00*    (2017.01)
  *G06Q 10/04*   (2012.01)

(52) U.S. Cl.
  CPC ............ *B64F 5/00* (2013.01); *G06F 17/5095* (2013.01); *G06Q 10/04* (2013.01)

(58) Field of Classification Search
  None
  See application file for complete search history.

(56) References Cited

U.S. PATENT DOCUMENTS

| | | | | |
|---|---|---|---|---|
| 2008/0215196 | A1* | 9/2008 | Deker ................. | G05D 1/0638 701/5 |
| 2008/0301012 | A1* | 12/2008 | Cogswell et al. .. | G06F 17/5095 703/8 |
| 2010/0274545 | A1* | 10/2010 | Greenberg .......... | G06F 17/5009 703/8 |
| 2014/0207429 | A1* | 7/2014 | Spira .................. | G06F 17/5009 703/2 |

* cited by examiner

*Primary Examiner* — Craig C Dorais
(74) *Attorney, Agent, or Firm* — Leydig, Voit & Mayer, Ltd.

(57) ABSTRACT

A method for designing an aircraft includes defining an initial catalog of requirements for at least one aircraft design. An optimization of the at least one aircraft design is carried out based on the catalog of requirements in terms of anticipated operating costs. A predefined total flight network is simulated with the at least one aircraft design and a total flight network efficiency is determined. It is then checked as to whether the determined total flight network efficiency constitutes an optimum. The catalog of requirements is adapted and an iteration is performed upon a determination that the determined total flight network efficiency does not constitute the optimum.

14 Claims, 2 Drawing Sheets

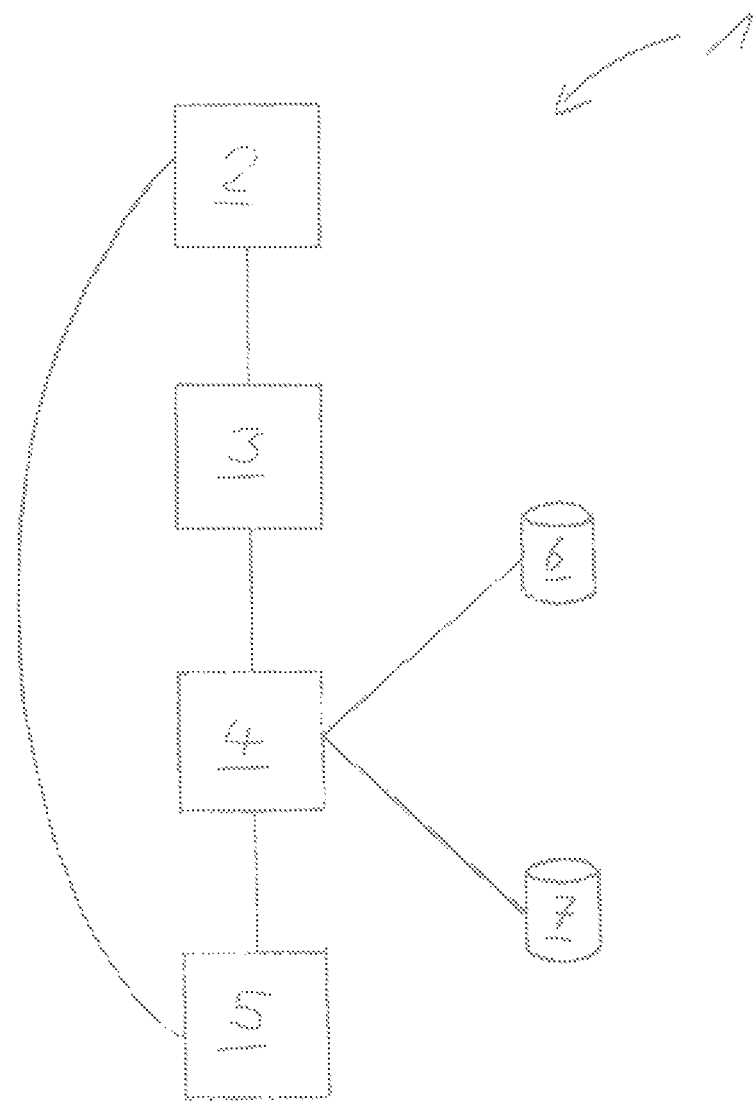

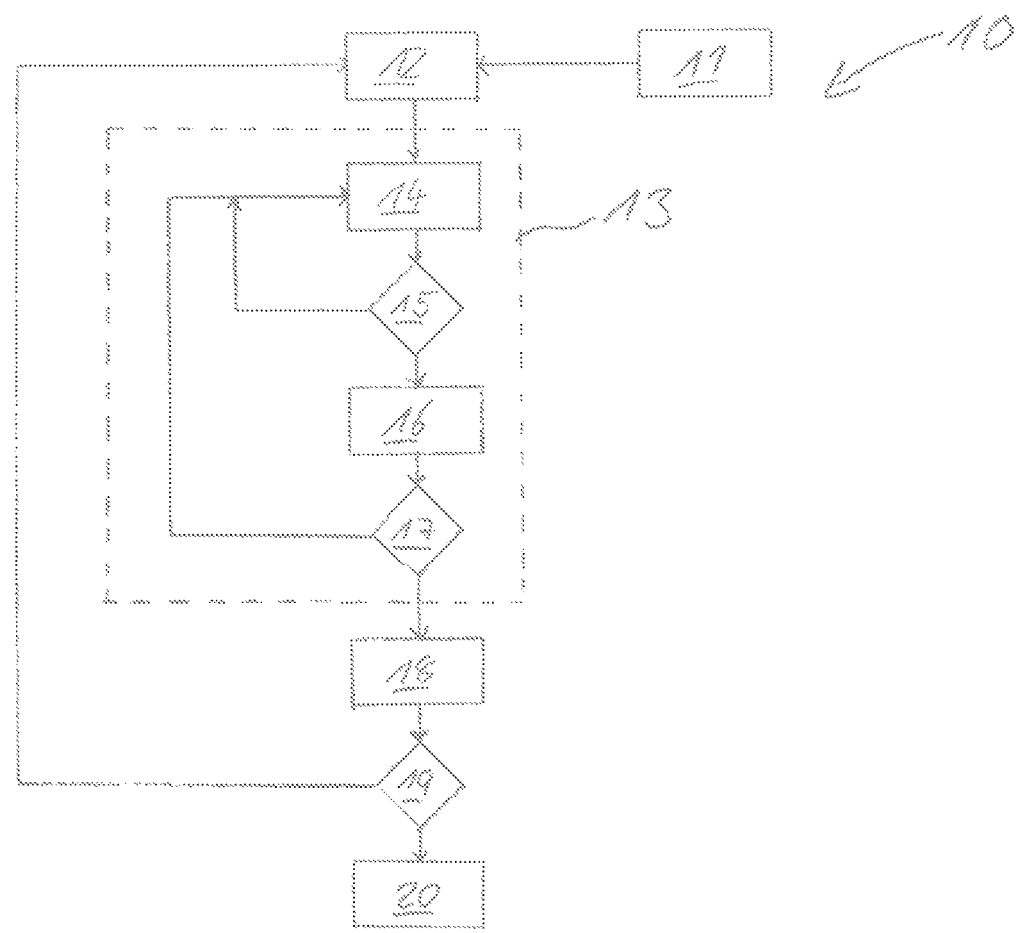

METHOD AND SYSTEM FOR DESIGNING AN AIRCRAFT

CROSS-REFERENCE TO PRIOR APPLICATION

Priority is claimed to European Patent Application No. EP 13194503.2, filed on Nov. 26, 2013, the entire disclosure of which is hereby incorporated by reference herein.

FIELD

The invention relates to a method and a system for designing an aircraft, in particular a passenger aircraft and a freight aircraft in the civil sector.

BACKGROUND

The design and construction of a new aircraft are very complex and extremely costly processes. Therefore an aircraft manufacturer who plans a new aircraft model, attempts to determine—before the actual design and development phase starts—in particular what technical operational and economic characteristics the envisaged new aircraft model should have in order to be successful commercially and therefore justify the high development costs.

Up until now it has been customary to do this by inviting representatives of airlines, and therefore representatives of potential customers, to what are referred to as customer focus group or airline advisory board events. At these events, the representatives of the airlines are asked to express requests regarding the configuration parameters of a new aircraft model. The configuration parameters enquired about include, for example, the desired payload (this relates essentially to the size of the fuselage with respect to the maximum number of passengers plus freight to be carried, for example), the range requirement, take off and landing requirements, the desired cruising altitude and, if appropriate, further configuration parameters such as, for example, the desired cruising speed, maximum values for the wing span, fuselage length and/or surface pressure per wheel of the landing gear.

The estimates regarding the configuration parameters which are issued by the representatives of the airlines are subsequently compiled and evaluated statistically. The aircraft manufacturer will then define configuration parameters determined on the basis of the statistical evaluation and according to further questioning of experts, as a configuration point for the new aircraft model.

On the basis of the configuration point determined in this way, a synthesis method is then applied which permits an aircraft design which satisfies the configuration point to be iteratively optimized in terms of the costs. The corresponding synthesis method according to the prior art is, inter alia, described in "Synthesis of Subsonic Airplane design: An introduction to the preliminary design of subsonic general aviation and transport aircraft, with emphasis on layout, aerodynamic design, propulsion and performance" by Egbert Torenbeek, published 1982 by Delft University Press, 9th Reprint 1999, and in "Advanced Aircraft Design: Conceptual Design, Technology and Optimization of Subsonic Civil Airplanes" by Egbert Torenbeek, published 2013 by John Wiley & Sons.

In the synthesis method, firstly dimensioning of the propulsion system, wings and empennage, mass estimation resulting therefrom together with the parameters of the configuration point and preliminary estimation of flight performance are optimized iteratively in such a way that the maximum takeoff weight converges and the range requirements and take off and landing requirements are satisfied according to the configuration point. Subsequently, a cost estimation is made for a correspondingly optimized design, wherein, in particular, the later operating costs are estimated. It is then checked whether the design is that which is optimum in terms of costs. If this is not the case, the iteration described above is frequently repeated with other output variables (for example the dimensioning of the propulsion system) until cost optimum is achieved.

The method described gives rise to an aircraft design which is optimized in terms of the predefined configuration point. However, in the methods known from the prior art it is not ensured that the configuration point to which the aircraft design is optimized is also selected in an optimum way. For example, in the prior art the ultimate configuration point is defined on the basis of customer consultations and subjective expert opinions, which undeniably entails the risk of selecting an "incorrect configuration point". As a result, an aircraft can be dimensioned "beyond market requirements" and will then only find few customers, if any at all. The consequences can be "fatal" owing to the high development costs for the aircraft manufacturer.

SUMMARY

In an embodiment, the present invention provides a method for designing an aircraft. In a step (a), an initial catalog of requirements is defined for at least one aircraft design. In a step (b), an optimization of the at least one aircraft design is carried out based on the catalog of requirements in terms of anticipated operating costs. In a step (c), a predefined total flight network is simulated with the at least one aircraft design and a total flight network efficiency is determined. It is then checked in a step (d) as to whether the determined total flight network efficiency constitutes an optimum. In a step (e), the catalog of requirements is adapted and an iteration is performed starting form the step (b) upon a determination that the determined total flight network efficiency does not constitute the optimum.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following:

FIG. 1 shows a system according to an embodiment of the invention which is designed to carry out the method according to an embodiment of the invention; and FIG. 2 shows a one-piece flowchart of the method according to an embodiment of the invention in the way in which it runs on the system according to FIG. 1.

DETAILED DESCRIPTION

In an embodiment the present invention provides an improved method and system for designing an aircraft, which no longer have the disadvantages from the prior art, or only have these disadvantages to a reduced degree.

In one embodiment, the invention provides a method for designing an aircraft, comprising the steps:

a. defining an initial catalog of requirements for at least one aircraft design;
b. carrying out optimization of the at least one aircraft design on the basis of the catalog of requirements in terms of the anticipated operating costs;
c. simulating a predefined total flight network with the at least one aircraft design and determining the total flight network efficiency;
d. checking whether the determined total flight network efficiency constitutes an optimum; if not:
e. adapting the catalog of requirements and performing iteration starting from step (b).

In another embodiment, the invention provides a system comprising:

a catalog of requirements memory for storing a catalog of requirements for at least one aircraft design;
a synthesis module for determining aircraft designs optimized in terms of costs, on the basis of the catalog of requirements from the catalog of requirements memory;
a simulation module for carrying out a simulation of a total flight network with the aircraft designs determined by the synthesis module (3) and for determining the total flight network efficiency; and
an optimization module for checking whether the total flight network efficiency determined by the simulation module is an optimum, and for changing the catalog of requirements in the catalog of requirements memory if no optimum of the total flight network efficiency is present.

The method according to an embodiment of the invention for designing an aircraft is defined in that not only is an aircraft design optimized to a specific, predefined catalog of requirements but in addition the catalog of requirements is also optimized in such a way that an ultimate aircraft design is matched as well as possible to a predefined total flight network. In contrast to the prior art, not only is an individual aircraft design optimized in terms of costs on the basis of a predefined configuration point, but it is also ensured that the configuration point for an aircraft design is optimized in respect of a predefined total flight network.

Before embodiments of the invention and the advantages thereof are described further, firstly a number of terms which are used in relation to the invention will be explained in more detail.

The "catalog of requirements" contains a compilation of individual technical requirements relating to the at least one aircraft design. These requirements may comprise, for example, the payload, the range and take off and landing requirements, for example for airports at high altitudes in hot regions (hot and high airports) or particularly short runways. Minimum cruising altitude, minimum cruising speed and/or maximum values for the wing span, fuselage length and/or surface pressure per wheel of the landing gear may also be predefined. Alternatively or additionally to the minimum payload, requirements relating to the number of passenger seats may also be provided.

The catalog of requirements can comprise the technical requirements for an individual aircraft design. However, it is also possible for the catalog of requirements to comprise corresponding requirements for a plurality of different aircraft designs. It is therefore possible, for example, for a catalog of requirements to contain, on the one hand, requirements for a short-haul aircraft and, on the other hand, requirements for a long-haul aircraft. Certain links between the requirements for a plurality of different aircraft designs can also be predefined in the catalog of requirements. It is therefore possible, for example, to define that two aircraft designs are to have identical wings in order to reduce the overall development costs for both aircraft designs.

A "total flight network" is the collection of all the flight routes of one or more airlines which are served or are to be served by these airlines. The total flight network is therefore not only limited to those flight routes which it is to be possible to serve by a new aircraft design according to expert opinion. It is also possible for the total flight network which forms the basis for the method or system according to embodiments of the invention to constitute merely a partial network of a flight network which is actually present. For example, in order to simplify the simulation of the total flight network individual routes for which an already existing aircraft type has been specifically developed (for example extreme long-haul) can be excluded from the simulated total flight network. However, in this case also the total flight network is still not limited only to those routes which it is to be possible to serve by a new aircraft design according to expert opinion.

For the simulation of the total flight network, not only information about the length of the respective flight route but preferably also information about the take off and landing conditions at the individual airports of the respective flight route are available for each individual flight route. Furthermore, for example, maximum values for the wing span, fuselage length and/or surface pressure of a wheel of the landing gear can be predefined for the individual airports in the total flight network. Furthermore, information about the payload volume on a flight route and/or information about the number of time windows at which a specific airline is allowed to start and land at an airport (airport slots) can also be available. Alternatively or additionally to the payload volume, the passenger volume on a flight route can also be available.

The total flight network which is used as the basis for the simulation of the method according to an embodiment of the invention can be an actual total flight network of one or more airlines. However, it is also possible for a theoretical total flight network to be used as the basis for the simulation. It is therefore possible, for example, to project a future total flight network, which constitutes, for example, the anticipated or planned total flight network in the near future or in ten or twenty years, on the basis of an actual total flight network.

In the method according to an embodiment of the invention, firstly an initial catalog of requirements for at least one new aircraft design is defined. This initial catalog of requirements can contain the technical requirements for just one aircraft design. However, it is also possible for the initial catalog of requirements to contain technical requirements for a plurality of aircraft designs, for example one or more short-haul aircraft and one or more long-haul aircraft.

Subsequently, optimization of the respective aircraft design is carried out individually for each aircraft design for which the catalog of requirements contains technical requirements. The optimization is carried out here primarily in terms of the operating costs of an aircraft design, wherein the operating costs can be calculated as functions of technical variables or of the configuration of the aircraft design. It is therefore possible, for example, to calculate the fuel consumption and the associated costs from technical parameters such as, inter alia, the thrust/mass ratio and/or the aerodynamic quality of the aircraft design; the maintenance costs can be determined as a function of the aircraft mass or the number of engines; airport taxes are dependent on the aircraft mass etc. Corresponding calculations of the anticipated costs for an aircraft design are known from the prior art.

In order to optimize the operating costs or the underlying technical variables it is possible to have recourse to the synthesis method already known from the prior art. In this method, firstly various design variables such as dimensioning of the propulsion system, wings and empennage, and on the basis thereof at least to a certain extent resultant variables such as the lift distribution of the wing, mass, center of gravity, drag and flight performance are iterated until the maximum takeoff weight converges, while complying with the other constraints such as the range requirement, take off and landing requirements etc. Subsequently, an estimate of the operating costs is carried out and the iterative method described above is repeated until an operating cost optimum is obtained. Anticipated operating costs can be determined on the basis of technical variables of the aircraft design, as explained above.

With the aircraft design or designs optimized in this way, the total flight network is then simulated and the total flight network efficiency is determined. In this context, a flight route efficiency is determined for each flight route of the total flight network and the individual flight route efficiencies are summed to form the total flight network efficiency. A flight route efficiency is calculated from the receipts which are anticipated for a specific aircraft design on a specific flight route, minus the costs for the use of the aircraft design on this route. Flight route efficiency values for a specific route can be determined here only for aircraft designs which meet the technical requirements for serving the flight route, for example that is to say have a sufficient range.

During the simulation of the total flight network it is possible for two or more aircraft designs to be suitable for use on one specific flight route. In this case, the efficiency potential of each individual aircraft design which is suitable for use on the respective flight route is preferably calculated. Subsequently, the aircraft design whose efficiency value contributes to the maximum total flight network efficiency value during this simulation step is selected for this flight route.

It is also possible that during the simulation individual flight routes cannot be served by any of the simulated aircraft designs. In this case, the route which cannot be served can be associated with high costs, which ultimately results in a situation in which the total flight network efficiency of a simulation during which the individual flight routes cannot be served cannot constitute an optimum. Alternatively, the simulation of the total flight network can also be discontinued if a flight route cannot be served by any of the simulated aircraft designs.

Constraints relating to the selection of the aircraft designs which are provided for the individual flight routes can be predefined for the simulation of the total flight network and the determination of the total flight network efficiency. It could therefore be possible, for example, to predefine that in the total flight network or in a specific part of the total flight network only a maximum number of different aircraft designs are to be used and/or that any aircraft design used in the total flight network is to be or must be capable of being used on a minimum number of individual flight routes in the total flight network. The maximum number of different aircraft designs is preferably greater than or equal to two here. Through corresponding constraints, a fleet of different aircraft designs on the total flight network, which is too heterogeneous and therefore cannot be operated economically can already be ruled out in this method step.

The anticipated receipts which are necessary for the calculation of a flight route efficiency can be calculated, for example, from the payload volume or passenger volume on a flight route, the available airport slots and the payload of an aircraft, which can also be converted into number of seats in the aircraft. In this context, empirical values such as average loads and seasonal fluctuations in the passenger volume or payload volume on a flight route can also be taken into account.

If the simulated flight route is a passenger route it is preferred if the passenger volume on the flight route is broken down into standard fare passengers and special fare passengers. Standard fare passengers are those who (have to) travel on a flight route for prescribed external reasons (for example inflexible deadlines) and are therefore prepared to buy a flight ticket even at the normal price. The group of standard fare passengers includes, in particular, business travelers. The special fare passengers are passengers who are not necessarily tied to one flight route but are also prepared to select a different itinerary (for example a detour) to arrive at their destination. Passengers of this type tend to use a dedicated flight route if they can buy inexpensive flight tickets. As a rule, such price-sensitive passengers often travel for personal reasons, such as for example holidays.

If the passenger volume is broken down into standard fare passengers and special fare passengers, a detailed calculation of the anticipated receipt is possible. In particular, during the simulation it is therefore possible to model the effect that in the case of a proportional change in the passenger volume of standard fare passengers in relation to special fare passengers, the average ticket price of the tickets on a flight route, and therefore also the flight route efficiency changes. If, for example, the passenger volume of standard fare passengers increases and the passenger volume of special fare passengers remains unchanged, the portion of special fare passengers and therefore the average ticket price of the tickets on a flight route and therefore also the flight route efficiency drops.

Of course, a comparable situation also applies for various payloads which can also be broken down into a "standard rate" payload and a "special rate" payload. A standard rate payload can therefore relate to payloads which have to be transported quickly at a specific point in time, for example urgent spare parts, while special rate payloads can readily also be transported by other means of transportation without wasting time if the other means of transportation are more cost-effective.

The costs which are also necessary to calculate a flight route efficiency are the operating costs which are anticipated for a specific aircraft on the flight route. These anticipated operating costs can be determined or estimated in a known fashion by means of technical variables of the aircraft design. Operating costs can comprise fuel costs, maintenance costs, personnel costs, airport charges etc. It is also possible for the costs for a flight route to comprise proportionally the development costs for a new aircraft. The development costs can be transferred portionally here, for example, to those flight routes on which the newly developed aircraft is to be used according to the simulation of the total flight network.

If the flight route efficiency is calculated for each flight route of the total flight network and summed to form the total flight network efficiency, it is subsequently checked whether the total flight network efficiency which is determined by means of the simulation is an optimum. If this is the case, an optimized aircraft design or a plurality of optimized aircraft designs are available. If an optimum has not yet been reached, the catalog of requirements is changed and the described method is run through iteratively until an optimum is reached.

Since the method according to an embodiment of the invention is an iterative method, checking as to whether an optimum is present will as a rule not be possible at the first pass. In this case, the checking for an optimum has a negative result and the individual method steps are correspondingly iterated with a changed catalog of requirements until the checking for an optimum can actually be carried out and the presence of an optimum becomes apparent. In this context it is basically possible that a total flight network efficiency which was determined during the first iteration steps proves to be an optimum, but at the point in time of the determination thereof it was not possible to identify it as such.

A minimum number of iteration steps can also be predefined, wherein the iteration steps are respectively carried out with a changed catalog of requirements. If a number of total flight network efficiencies which corresponds to the number of minimum iterations is available on the basis of different catalog of requirements, checking as to whether a further total flight network efficiency which is calculated according to the method according to an embodiment of the invention constitutes an optimum is basically possible. However, iteration is also carried out here until an actual optimum has been found.

Depending on the object which is set, the method according to an embodiment of the invention can determine a local or absolute optimum in the total flight network efficiency. A local optimum can be desired, for example, if a specific aircraft model which is already present is to be replaced and a limited number of aircraft designs which are optimized according to an embodiment of the invention is to close the resulting gap. An absolute optimum can be desired, in particular, when a multiplicity of different aircraft designs which are optimized according to an embodiment of the invention is to cover the widest possible spectrum of requirements.

In addition the at least one optimized aircraft design, the result of the simulation of the total flight network can also be considered to be a further result of the method. From the result of the simulation it is possible to infer which aircraft design should be used on which flight route of the total flight network in order to achieve an optimum total flight network efficiency.

In contrast to the prior art, in the method according to an embodiment of the invention an aircraft design is therefore not optimized solely in respect of a predefined configuration point but instead this configuration point is also optimized in the form of a variable catalog of requirements. As a result, one or more aircraft designs which are therefore tailored to a predefined total flight network in such a way that an optimum total flight network efficiency can be achieved are obtained.

During the adaptation of the catalog of requirements it is possible that the number of aircraft designs for which the catalog of requirements contains requirements changes. It is therefore possible to determine in the method an embodiment of according to the invention, for example, that the total flight network efficiency can be increased if instead of an individual new aircraft design two new aircraft designs are provided instead of the development costs which are increased as a result, wherein one of the two aircraft designs is optimized for a first part of the routes of the total flight network, while the other aircraft design is optimized for a second part of the routes of the total flight network.

In the method according to an embodiment of the invention, boundary conditions relating to the maximum number of possible aircraft designs can also be predefined. It is therefore possible, for example, to limit the number of new aircraft designs or the level of the summed development costs for all the new aircraft designs. This permits the development capacities of aircraft manufacturers to be taken into account.

In particular in the cases in which the number of new aircraft designs is limited, but also in all other cases, it is preferred if during the simulation of the total flight network not only the aircraft designs on the basis of the catalog of requirements but also aircraft models which are already available are taken into account. In this context, all the aircraft models which are already available or only a number thereof can be taken into account. The simulation of the total flight network then therefore no longer remains limited to the new aircraft designs which are determined with the synthesis method according to the catalog of requirements but rather also takes into account aircraft models which are already available commercially. As a result it is as a rule possible to serve all the flight routes of a flight network and to adapt the new aircraft design or designs in an optimum way to some of the routes in the flight network, with the result that an optimum of the total flight network efficiency is achieved by taking into account already available aircraft models.

If the method according to an embodiment of the invention is to be primarily used to replace a specific aircraft model which is already available by a new aircraft design, the simulation can be carried out during the method with the aircraft design of the other available aircraft models. The specific available aircraft model is then preferably excluded from the simulation and the aircraft design is optimized in such a way that it replaces the specific available aircraft model in the best way possible. The initial catalog of requirements for the new aircraft design can be oriented here with respect to the technical characteristics of the specific aircraft model, but is optimized in the course of the method according to an embodiment of the invention as described.

The method according to an embodiment of the invention taking into account already known aircraft models in the simulation will become clear with reference to an example. If, for example, a long-haul aircraft is available and if said aircraft is taken into account in the simulation, the method according to an embodiment of the invention will, in the case of a total flight network comprising long-haul and short-haul routes and in the case of the stipulation to optimize just a single aircraft design, tend to give rise to an aircraft design which is adapted to the short-haul routes. In this context, the method according to an embodiment of the invention will automatically determine which routes are to be served with which aircraft, in order to achieve an optimum total flight network efficiency. It is therefore conceivable, for example, that the total flight network efficiency is at a maximum if the majority of the short-haul routes are covered by the new aircraft design, but a small number of the short-haul connections with particular take off and landing requirements are nevertheless served by the already available long-haul aircraft. The method according to an embodiment of the invention namely takes into account the fact that if the new aircraft design were also to be suitable for the specified small number of short-haul routes, the operating costs of the aircraft design would basically increase in such a way that the efficiency on the other short-haul routes would drop. In total, the total flight network efficiency could therefore no longer be at a maximum. In contrast to the development methods according to the prior art, the method according to an embodiment of the invention in the specified example can therefore give rise to an aircraft design for a short-haul aircraft which, although it cannot serve all the short-haul routes of the total flight network, is advantageous overall even when specific short-haul routes are served by the already present long-haul aircraft.

In summary it is to be noted that the method according to an embodiment of the invention is distinguished by the fact that on the basis of a catalog of requirements with technical requirements for one or more aircraft designs one or more optimized aircraft designs are determined iteratively taking into account variables which can be derived from the technical configuration of one or more aircraft designs, and a total flight network. The aircraft designs which are obtained in this way are distinguished by a configuration which is optimized with respect to the total flight network, as a result of which, on the one hand, the total flight network efficiency can be increased, and, on the other hand, for example, the total fuel consumption of the aircraft used on the total flight network can also be reduced, since the aircraft which are provided for the individual flight routes are adapted to these flight routes as well as possible.

The system according to an embodiment of the invention is designed to carry out the method according to an embodiment of the invention. For an explanation of the system, reference is therefore made to the statements above.

It is preferred to provide a first database which is connected to the simulation module and comprises information on all the flight routes of the total flight network. The simulation which is to be carried out by the simulation module can then take place on the basis of the data from the first database.

It is further preferred to provide a second data base which is connected to the simulation module and comprises information on available aircraft models. The simulation module is then preferably designed to take into account this information while the simulation of the total flight network is being carried out.

The system can also preferably be designed to carry out the method according to an embodiment of the invention and the advantageous developments of the method. For an explanation of these developments, reference is made to the statements above.

FIG. 1 illustrates a system 1 according to an embodiment of the invention which is designed to carry out the method according to an embodiment of the invention. The system 1 comprises a catalog of requirements memory 2, a synthesis module 3, a simulation module 4 and an optimization module 5. The cited components are connected to one another in series. Furthermore, the optimization module 5 is also connected to the catalog of requirements memory 2.

Furthermore, a first data base 6 and a second data base 7, are provided and are each connected to the simulation module 4. In the first data base 6, a total flight network is modeled, i.e. information on all the flight routes of the total flight network is stored in the data base 6. Information on all the aircraft, or on some of the commercially available aircraft, is stored in the second data base 7.

A catalog of requirements comprising technical requirements for a new aircraft design is stored in the catalog of requirements memory 2. These technical requirements can comprise the minimum payload, the minimum range and take off and landing requirements for one or more aircraft designs. In addition, requirements relating to the cruising altitude and/or the cruising speed as well as maximum values for the wing span, fuselage length and/or surface pressure per wheel of the landing gear can also be included. At the start, the catalog of requirements is predefined manually, but, as explained below, it is changed iteratively by the method 10 according to an embodiment of the invention (cf. FIG. 2).

The catalog of requirements from the catalog of requirements memory 2 is fed to the synthesis module 3 which, on the basis of the technical requirements, carries out a synthesis method for optimizing one or more aircraft designs in accordance with the technical requirements. The result of this synthesis method are one or more aircraft designs which are based on the catalog of requirements and as far as possible have optimum and have the best possible, i.e. low, operating costs. These one or more iteratively determined aircraft designs are transmitted to the simulation module 4.

The simulation module 4 is designed to carry out a simulation of the total flight network which is modeled in the first data base 6. For this purpose, the simulation module 4 calculates a flight route efficiency for each flight route of the total flight network, wherein the potential efficiency is calculated on a flight route for all the available aircraft designs which are transmitted by the synthesis module 3 and for the available aircraft models which are stored in the second data base 7, which are basically suitable in terms of their technical specifications for serving the flight route. The respective potential efficiency which contributes to the highest total flight network efficiency value in this simulation step is then selected as the ultimate flight route efficiency.

Subsequently, the total flight network efficiency is formed as a sum of the individual flight route efficiencies by the simulation module 4 and is transmitted to the optimization module 5.

The optimization module 5 checks whether the total flight network efficiency is an optimum. If this is the case, the aircraft design or designs which are determined by the synthesis module 3 are output as optimized aircraft designs. If there is no optimum of the total flight network efficiency available, the catalog of requirements in the catalog of requirements memory 2 is changed by the optimization module 5, and the method is repeated iteratively until an optimum total flight network efficiency is present.

The method which is carried out by the system 1 according to FIG. 1 will now be explained in more detail with reference to the flowchart from FIG. 2. Details such as how the individual components of the system 1 according to FIG. 1 can be constructed can also be obtained from the following statements.

At the start of the method 10 according to an embodiment of the invention, an initial catalog of requirements is defined. This definition can be done by manual inputting (step 11). This catalog of requirements contains technical requirements for one or more aircraft designs. The technical requirements include minimum payload, minimum range and take off and landing requirements. In addition, requirements relating to the cruising altitude and/or the cruising speed can also be included. The catalog of requirements can be directed to an individual aircraft design, that is to say contain merely one set of technical requirements. However, it is also possible for the requirements schedule to contain requirements for a plurality of aircraft designs, wherein a number of sets of technical requirements which corresponds to the number of aircraft designs is then included.

The initial catalog of requirements is stored in such a way that, as explained later, it can be changed during the method according to an embodiment of the invention (step 12).

On the basis of the catalog of requirements, firstly a synthesis method 13 which is known from the prior art is carried out. In the synthesis method 13, an aircraft design which is optimized in terms of the anticipated costs, in particular the anticipated operating costs, is determined for each aircraft design placed in the catalog of requirements.

In the synthesis method 13, firstly an initial fuselage dimensioning and an initial dimensioning of the propulsion system, wings and empennage is carried out for an aircraft design. On the basis of these variables, an estimation of the mass can then be carried out and the lift distribution of the wings and the center of gravity can be determined, the drag of the aircraft design estimated and not least the flight performance of the aircraft design with the assumed dimensions can be determined (step 14).

It is then checked whether the maximum takeoff weight of the aircraft design converges and the technical requirements from the catalog of requirements for this aircraft design, in particular range requirements, take off and landing requirements and, if appropriate, the cruising altitude, cruising speed and/or surface pressure per wheel of the landing gear are satisfied (step 15). If this is not the case, the dimensioning of the fuselage and the dimensioning of the propulsion system, wings and empennage is changed and step 14 is carried out again. An iterative process occurs which is carried out until the maximum takeoff weight of the aircraft design converges and the technical requirements from the catalog of requirements for this aircraft design are met.

If the corresponding checking in step 15 is positive, in a subsequent step the anticipated costs for the aircraft design are calculated (step 16). The operating costs can be determined here as a function of technical variables or the configuration of the aircraft design. It is therefore possible, for example, to calculate the fuel consumption and the associated costs from the thrust/mass ratio of the aircraft design, and the maintenance costs can be determined as a function of the aircraft mass and the number of engines; airport taxes are dependent on the aircraft mass etc.

In step 17 it is then checked whether an optimum is achieved in terms of the costs calculated in step 16. If this is not the case, the dimensioning of the fuselage and the dimensioning of the propulsion system, wings and empennage is changed again, and the process is continued with step 14. This is repeated until a cost optimum is reached. If this is the case, the aircraft design which is determined by means of this iterative method is fed to the following step 18.

The synthesis method 13 is carried out separately for each aircraft design for which technical requirements are present in the catalog of requirements, with the result that in the case of technical requirements for more than one aircraft design a correspondingly larger number of aircraft designs are also fed to step 18.

In step 18, the total flight network is simulated. For this purpose, in each case a flight route efficiency is determined for each route of the total flight network. For this purpose, the receipts and operating costs which are anticipated for a flight route with a specific aircraft design or an aircraft model which is already available, such as can be stored, for example, in the first data base 6 (cf. FIG. 1), are offset against one another. In addition to the actual operating costs, the development costs of a new aircraft can also be included proportionally in the calculation of the flight route efficiency. If more than one aircraft design or available aircraft is suitable, from the technical point of view, for serving a specific flight route of the total flight network, the potential efficiency on the flight route is calculated for each aircraft design or each available aircraft. The potential efficiency which contributes to the highest total flight network efficiency value for a particular route in this simulation step is selected as the ultimate flight route efficiency for said flight route. During the selection of the aircraft designs or the available aircraft for the individual flight routes in the total flight network, constraints such as the maximum number of different aircraft types in the total network or the minimum number of aircraft of a specific aircraft type can also be taken into account. Subsequently, the individual flight route efficiencies are summed to form the total flight network efficiency.

In step 19 it is then checked whether an optimum in terms of the total flight network efficiency is present. If this is not the case, the catalog of requirements is changed and the method 10 starts again at step 12. The catalog of requirements is iterated here until an optimum of the total flight network efficiency is present. In this context, the catalog of requirements can also be changed to such an extent that the number of ultimate aircraft designs changes.

If an optimum of the total flight network efficiency is reached, the method 10 then ends with step 20 in which one or more optimized aircraft designs are then present. In addition to the at least one aircraft design, the result of the simulation from step 18 is then also present, from which result it is apparent which flight routes in the examined total flight network should be served by the at least one aircraft design or other available aircraft in order to achieve an optimum total flight network efficiency.

An embodiment of the invention will now be explained in more detail with reference to a numerical example. In this example, an aircraft family comprising two aircraft which are suitable for long-haul routes is to be designed.

In the catalog of requirements, initially two sets of technical requirements, which each model the requirements of an aircraft design, are predefined here. For the first aircraft design the initial requirements are with respect to the payload 60 t in the case of minimum range of 6750 NM, while the second aircraft design is to initially have a payload of 50 t in the case of a minimum range of 7750 NM. The initial take off and landing requirements for both aircraft designs are tailored to the most unfavorable airport of the total flight network, i.e. according to the initial requirements both aircraft designs should be able to start and land at this airport with a runway length of 3000 m given an airfield reference temperature of 30° C. and an altitude 2500 m above sea level (mean sea level). The initial requirements for the two aircraft designs according to the catalog of requirements are combined in the following table:

|   | Payload | Range | Take off/landing conditions |
|---|---------|-------|------------------------------|
| A | 60 t | 6750 NM | 3000 m at 30° C. at 2500 m a.s.l. |
| B | 50 t | 7750 NM | 3000 m at 30° C. at 2500 m a.s.l. |

In order to limit the development costs for the aircraft family, it is also defined that both aircraft designs which are to be determined are to be equipped with identical wings and identical engines. Furthermore, it is defined that the result of the method according to an embodiment of the invention is to remain limited to a maximum of two aircraft designs.

In a first step, in a synthesis method for the two aircraft designs, in each case the optimum configuration is determined in terms of the operating costs of said designs. For this purpose, the various design variables such as fuselage length and dimensioning of the propulsion system, wings and empennages is varied until in each case the maximum takeoff weight converges, while the other constraints such as the range requirement and take off and landing requirements of the respective aircraft design are complied with. The maximum takeoff weight and the range characteristics or take off and landing characteristics of an aircraft design can be determined from the design variables and resulting intermediate variables such as the distribution of the lift of the wing, mass, center of gravity, drag and flight performance. In this context it is to be noted that according to the specification in the present example the dimensioning of the propulsion system, wings and empennage is to be the same in both aircraft designs.

Subsequently, an estimate of the operating costs is made for each design and the prescribed iterative method is repeated until an operating cost optimum is present. The anticipated operating costs can be respectively determined on the basis of the technical variables of the aircraft designs, as explained above.

As a result of the synthesis method, two aircraft designs are obtained which have identical wings, empennages and engines, but differ in the fuselage length.

Subsequently, a simulation of the total flight network is carried out. In this example, the total flight network is to comprise a total of five flight routes:

|   | Length  | Payload volume/day | Aircraft slots/day |
|---|---------|--------------------|--------------------|
| 1 | 5500 NM | 55 t               | 2                  |
| 2 | 4500 NM | 130 t              | 3                  |
| 3 | 7000 NM | 40 t               | 2                  |
| 4*| 5000 NM | 40 t               | 1                  |
| 5 | 1200 NM | 120 t              | 6                  |

The route marked by "*" comprises the "most unfavorable" airport of the total flight network with a runway length of 3000 m at an airfield reference temperature of 30° C. and an elevation 2500 m above sea level. The other routes each have take off and landing conditions which are comparable to a runway length of 2500 m under standard conditions.

In addition to the two aircraft designs A and B, a known, commercially available aircraft model C is also taken into account in the simulation. The aircraft model C is a short-haul aircraft with the following characteristics:

|   | Payload | Range   | Take off/landing conditions    |
|---|---------|---------|--------------------------------|
| C | 20 t    | 1500 NM | 1600 m under standard conditions |

In the simulation of the total flight network, the flight route efficiency is then calculated for each individual flight route, wherein, firstly, in each case the potential efficiency is calculated on a route for each aircraft design or each available aircraft model which can basically be used on a flight route. For example, on flight routes 1, 2 and 4 the aircraft designs A and B are basically used, while on the flight route 3 only the aircraft design B can be used, since the aircraft design A does not have the necessary maximum range. The aircraft designs A and B as well as the already available aircraft model C can be used on the flight route 5.

During the simulation it is determined what aircraft design or aircraft model makes it possible to achieve the maximum efficiency on a flight route. For this purpose, the anticipated profits and the incurred operating costs are determined for each route and offset against one another. A total flight network efficiency X is then obtained from the sum of the individual flight route efficiencies.

During the simulation of the total flight network on the basis of the aircraft designs A and B and the available aircraft model C, the following breakdown can be obtained, for example:

| Route | Aircraft design/model | Number flights/day |
|-------|-----------------------|--------------------|
| 1     | A                     | 1                  |
| 2     | A                     | 3                  |
| 3     | B                     | 1                  |
| 4     | B                     | 1                  |
| 5     | C                     | 6                  |

Since at this point in time it is not possible to determine whether the total flight network efficiency X is an optimum, the method steps described above are carried out again, but the catalog of requirements for the aircraft designs is changed. The changed requirements for the two aircraft designs according to the catalog of requirements are:

|    | Payload | Range   | Take off/landing conditions          |
|----|---------|---------|--------------------------------------|
| A' | 65 t    | 5500 NM | 2500 m under standard conditions     |
| B' | 40 t    | 7000 NM | 3000 m at 30° C. at 2500 m a.s.l.    |

On the basis of the changed catalog of requirements for the aircraft designs A' and B', firstly operating-cost-optimized aircraft designs are determined by means of the synthesis method, which designs are then fed, together with the already known aircraft model C, to the simulation of the total flight network.

In the simulation of the total flight network on the basis of the aircraft designs A' and B' and the available aircraft model C, the following breakdown can be obtained, for example:

| Route | Aircraft design/model | Number flights/day |
|-------|-----------------------|--------------------|
| 1     | A                     | 1                  |
| 2     | A                     | 2                  |
| 3     | B                     | 1                  |
| 4     | B                     | 1                  |
| 5     | C                     | 6                  |

The total flight network efficiency X' which occurs during this simulation is higher than the total flight network efficiency X from the previous simulation. This is due to the fact that the aircraft design A' is now tailored well to the routes 1 and 2 and, for example, no longer has to satisfy any particular take off and landing conditions, while the aircraft design B' is tailored to the conditions of the routes 3 and 4. The already available (short-haul) flight model C continues to be well suited to serving the short-haul route 5.

The specified steps can be repeated with such a frequency that the optimum of the total flight network efficiency is reached. In the illustrated exemplary embodiment it is to be assumed that the aircraft designs A' and B' are the aircraft designs which are optimum in terms of the total flight network to be examined. In addition to the information about the optimum aircraft designs A' and B', the method according to an embodiment of the invention also additionally provides the information as to which aircraft design or which already available aircraft model is to be used on which flight routes in order to achieve the optimum total flight network efficiency.

Of course, it is possible to refine the method according to the invention which is illustrated only in one example. It is therefore possible, for example, to base the simulation on a seasonal profile of a passenger volume instead of the payload volume per day, wherein the passenger volume is preferably broken down into standard fare passengers and special fare passengers in order to be able to estimate better the anticipated efficiency on a flight route. It is, of course, also possible to take into account more flight routes and/or aircraft designs or aircraft models in the simulation. Complex relationships between individual flight routes, for example as flight routes with an intermediate stop, can also be modeled. By means of the simulation it is also possible to determine how many machines of an aircraft design or aircraft model are necessary to serve the examined total flight network.

The examined total flight network can be an actual current flight network of one or more airlines. However, it is also possible to use an actual total flight network to project a future total flight network which constitutes the anticipated total flight network in ten or twenty years, for example. This provides the advantage that the at least one aircraft design which is determined by means of the method according to an embodiment of the invention is adapted to the requirements toward the end of its development time.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A method for designing an aircraft, the method comprising:
   a. defining an initial catalog of requirements for at least one aircraft design, the catalog of requirements comprising requirements relating to one or more of a minimum payload, a minimum range, take off and landing requirements, a minimum cruising altitude, a minimum cruising speed and maximum values for one or more of a wing span, a fuselage length and a surface pressure per wheel of a landing gear for the at least one aircraft design;
   b. carrying out an optimization of the at least one aircraft design based on the catalog of requirements in terms of anticipated operating costs;
   c. simulating a predefined total flight network with the at least one aircraft design and determining a total flight network efficiency;
   d. checking whether the determined total flight network efficiency constitutes an optimum; and
   e. adapting the catalog of requirements and performing an iteration starting from step (b) upon a determination that the determined total flight network efficiency does not constitute the optimum.

2. The method as claimed in claim 1, wherein the simulation in step (c) uses information about one or more of a length of a flight route, take off and landing conditions for any airport on individual flight routes and maximum values for one or more of a wing span, a fuselage length and a surface pressure per wheel of the landing gear, which are made available for every flight route of the total flight network.

3. The method as claimed in claim 2, wherein the simulation in step (c) uses information about a payload volume or about airport slots at the airports on the individual flight routes, which are made available for every flight route of the total flight network.

4. The method as claimed in claim 3, wherein the payload volume is used in the simulation in step (c) and is broken down into a standard rate payload volume and a special rate payload volume.

5. The method as claimed in claim 1, wherein aircraft models which are already available are taken into account in the simulation in step (c).

6. The method as claimed in claim 1, wherein the adaptation of the catalog of requirements in step (e) gives rise to a change in a number of aircraft designs in the catalog of requirements.

7. The method as claimed in claim 1, further comprising providing constraints that are predefined in relation to a maximum number of aircraft designs or maximum development costs for all of the aircraft designs.

8. The method as claimed in claim 1, wherein the optimization in step (b) is carried out by means of a synthesis method.

9. A system for designing aircraft, the system comprising:
   a catalog of requirements memory storing a catalog of requirements for at least one aircraft design;
   a synthesis module configured to determine aircraft designs optimized in terms of costs based on the catalog of requirements from the catalog of requirements memory;
   a simulation module configured to carry out a simulation of a total flight network with the aircraft designs determined by the synthesis module and to determine a total flight network efficiency; and
   an optimization module configured to check whether the total flight network efficiency determined by the simulation module is an optimum and, upon a determination that the determined total flight network efficiency does not constitute the optimum, to change the catalog of requirements in the catalog of requirements memory.

10. The system as claimed in claim 9, further comprising a first data base connected to the simulation module and containing information on all flight routes of the total flight network.

11. The system as claimed in claim 9, further comprising a second data base connected to the simulation module and containing information on available aircraft models, the simulation module being configured to take into account the information on the available aircraft models while the simulation of the total flight network is being carried out.

12. The system as claimed in claim 9, wherein the system is configured to carry out a method for designing an aircraft, the method comprising:
   a. defining an initial catalog of requirements for the at least one aircraft design;
   b. carrying out the optimization of the at least one aircraft design based on the catalog of requirements in terms of anticipated operating costs;
   c. simulating the total flight network with the at least one aircraft design and determining the total flight network efficiency;
   d. checking whether the determined total flight network efficiency constitutes the optimum; and
   e. adapting the catalog of requirements and performing an iteration starting from step (b) upon a determination that the determined total flight network efficiency does not constitute the optimum.

13. The method as claimed in claim 1, further comprising manufacturing the aircraft in accordance with the at least one aircraft design based on the determined flight network efficiency constituting the optimum.

14. A method for designing an aircraft, the method comprising:
   a. defining an initial catalog of requirements for at least one aircraft design, the catalog of requirements comprising requirements relating to one or more of a minimum payload, a minimum range, take off and landing requirements, a minimum cruising altitude, a minimum cruising speed and maximum values for one or more of a wing span, a fuselage length and a surface pressure per wheel of a landing gear for the at least one aircraft design;
   b. carrying out an optimization of the at least one aircraft design based on the catalog of requirements in terms of anticipated operating costs, the operating costs being calculated as functions of technical variables or of a configuration of the at least one aircraft design;
   c. simulating a predefined total flight network with the at least one aircraft design and determining a total flight network efficiency, the total flight network efficiency being determined by summing up individual flight route efficiencies, the flight route efficiencies each being calculated using receipts that are anticipated for use of the at least one aircraft design on a respective flight route minus costs for the use of the at least one aircraft design on the respective flight route;
   d. checking whether the determined total flight network efficiency constitutes an optimum; and
   e. adapting the catalog of requirements and performing an iteration starting from step (b) upon a determination that the determined total flight network efficiency does not constitute the optimum.

* * * * *